(12) United States Patent
Harada

(10) Patent No.: US 10,217,616 B2
(45) Date of Patent: Feb. 26, 2019

(54) METHOD OF CONTROLLING TEMPERATURE AND PLASMA PROCESSING APPARATUS

(71) Applicant: Tokyo Electron Limited, Tokyo (JP)

(72) Inventor: Akitoshi Harada, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/308,970

(22) Filed: Jun. 19, 2014

(65) Prior Publication Data

US 2015/0004794 A1 Jan. 1, 2015

(30) Foreign Application Priority Data

Jun. 26, 2013 (JP) ................................. 2013-133414

(51) Int. Cl.
| | |
|---|---|
| *H01L 21/302* | (2006.01) |
| *H01L 21/461* | (2006.01) |
| *H01J 37/32* | (2006.01) |
| *H01L 21/67* | (2006.01) |
| *H01L 21/683* | (2006.01) |

(52) U.S. Cl.
CPC .. *H01J 37/32724* (2013.01); *H01L 21/67248* (2013.01); *H01L 21/6831* (2013.01)

(58) Field of Classification Search
CPC ......... H01J 37/32724; H01L 21/67248; H01L 21/6831
USPC ............ 156/345.27, 345.24, 345.51, 345.52, 156/345.29; 438/714, 715; 216/67
See application file for complete search history.

(56) References Cited

U.S. PATENT DOCUMENTS

| | | | | |
|---|---|---|---|---|
| 6,221,205 | B1* | 4/2001 | Blalock ............. | H01L 21/31116 118/723 E |
| 7,557,328 | B2* | 7/2009 | Ohata ................ | G05D 23/2715 118/725 |
| 7,993,460 | B2* | 8/2011 | Steger ................ | C23C 16/4586 118/728 |
| 8,809,197 | B2* | 8/2014 | Tabuchi .................. | H01L 22/26 438/710 |
| 8,880,227 | B2* | 11/2014 | Mahadeswaraswamy .................. | H01J 37/32522 118/697 |
| 9,685,320 | B2* | 6/2017 | Kang ................ | H01L 21/02274 |
| 2003/0186545 | A1* | 10/2003 | Kamp ............... | H01L 21/31116 438/689 |

(Continued)

FOREIGN PATENT DOCUMENTS

| | | |
|---|---|---|
| JP | 2000-012664 | 1/2000 |
| JP | 2004-047512 | 2/2004 |

(Continued)

*Primary Examiner* — Nadine G Norton
*Assistant Examiner* — Christopher Remavege
(74) *Attorney, Agent, or Firm* — IPUSA, PLLC

(57) ABSTRACT

A method of controlling a temperature is provided. In the method, a plasma process is performed in a processing chamber on an object to be processed placed on an electrostatic chuck configured to have its temperature adjustable. The electrostatic chuck is controlled to have a first temperature. The temperature of the electrostatic chuck is controlled in a step-by-step manner so as to change from the first temperature to a second temperature that is lower than the first temperature after performing the plasma process. An inside of the processing chamber is purged with an inactive gas after performing the plasma process.

15 Claims, 5 Drawing Sheets

(56) References Cited

U.S. PATENT DOCUMENTS

| | | | | |
|---|---|---|---|---|
| 2004/0182822 | A1* | 9/2004 | Chen | H01J 37/32935 216/67 |
| 2008/0207001 | A1* | 8/2008 | Lebouitz | H01L 21/3065 438/706 |
| 2009/0215201 | A1* | 8/2009 | Benjamin | H01L 21/67069 438/5 |
| 2011/0300714 | A1* | 12/2011 | Stevenson | H01L 21/67069 438/710 |
| 2011/0306214 | A1* | 12/2011 | Zin | H01J 37/32082 438/714 |
| 2014/0288726 | A1* | 9/2014 | Miura | H01L 21/67248 700/299 |
| 2016/0204000 | A1* | 7/2016 | Kubota | H01L 21/046 438/522 |
| 2016/0351407 | A1* | 12/2016 | Sawataishi | H01L 21/3065 |

FOREIGN PATENT DOCUMENTS

| | | |
|---|---|---|
| JP | 2010-010397 | 1/2010 |
| JP | 2010-056353 | 3/2010 |
| WO | 2010/026772 | 3/2010 |

* cited by examiner

METHOD OF CONTROLLING TEMPERATURE AND PLASMA PROCESSING APPARATUS

CROSS-REFERENCE TO RELATED APPLICATIONS

This patent application is based upon and claims the benefit of priority of Japanese Patent Application No. 2013-133414, filed on Jun. 26, 2013, the entire contents of which are incorporated herein by reference.

BACKGROUND OF THE INVENTION

1. Field of the Invention

The present invention relates to a method of controlling temperature and a plasma processing apparatus.

2. Description of the Related Art

A plasma processing method is proposed of placing a wafer on an electrostatic chuck having a preliminarily set high temperature and processing the placed wafer with plasma in order to enhance performance of the plasma processing. According to this method, there occurs a thermal expansion difference between the wafer and the electrostatic chuck due to the temperature difference between the wafer and the electrostatic chuck generated when the wafer is placed on the electrostatic chuck having the preliminarily set high temperature. As a result, sometimes a back surface of the wafer is rubbed against the electrostatic chuck, and particles are generated from the back surface of the wafer.

Therefore, as disclosed in Japanese Laid-Open Patent Application Publication No. 2000-12664, a method is proposed of controlling the thermal expansion difference between the wafer and the electrostatic chuck so as to be within a predetermined range by making the difference between the temperature of the wafer before being placed on the electrostatic chuck and a maximum temperature of the wafer after being placed on the electrostatic chuck a preliminarily set temperature or lower, thereby preventing the generation of the particles.

However, in the method disclosed in Japanese Laid-Open Patent Application Publication No. 2000-12664, the object to be processed needs to be heated in a preliminary heating chamber in order to set the temperature difference within the predetermined temperature range. As such, an apparatus structure and process become complicated.

SUMMARY OF THE INVENTION

Accordingly, in response to the above discussed problems, embodiments of the present invention aim at efficiently preventing generation of particles.

According to one embodiment of the present invention, there is provided a method of controlling temperature is provided. In the method, a plasma process is performed in a processing chamber on an object to be processed placed on an electrostatic chuck configured to have its temperature adjustable. The electrostatic chuck is controlled so as to have a first temperature. The temperature of the electrostatic chuck is controlled in a step-by-step manner so as to change from the first temperature to a second temperature that is lower than the first temperature after performing the plasma process. An inside of the processing chamber is purged with an inactive gas after performing the plasma process.

According to another embodiment of the present invention, there is provided a plasma processing apparatus that includes a processing chamber, an electrostatic chuck configured to have its temperature adjustable, and a control unit configured to control the temperature of the electrostatic chuck. The control unit is configured to control a plasma process on an object to be processed in the processing chamber while maintaining the temperature of the electrostatic chuck to have a first temperature, and then to control the temperature of the electrostatic chuck, in a step-by-step manner, from the first temperature to a second temperature that is lower than the first temperature while purging an inside of the processing chamber by an inactive gas.

Additional objects and advantages of the embodiments are set forth in part in the description which follows, and in part will become obvious from the description.

DETAILED DESCRIPTION OF THE PREFERRED EMBODIMENTS

Figure 1:
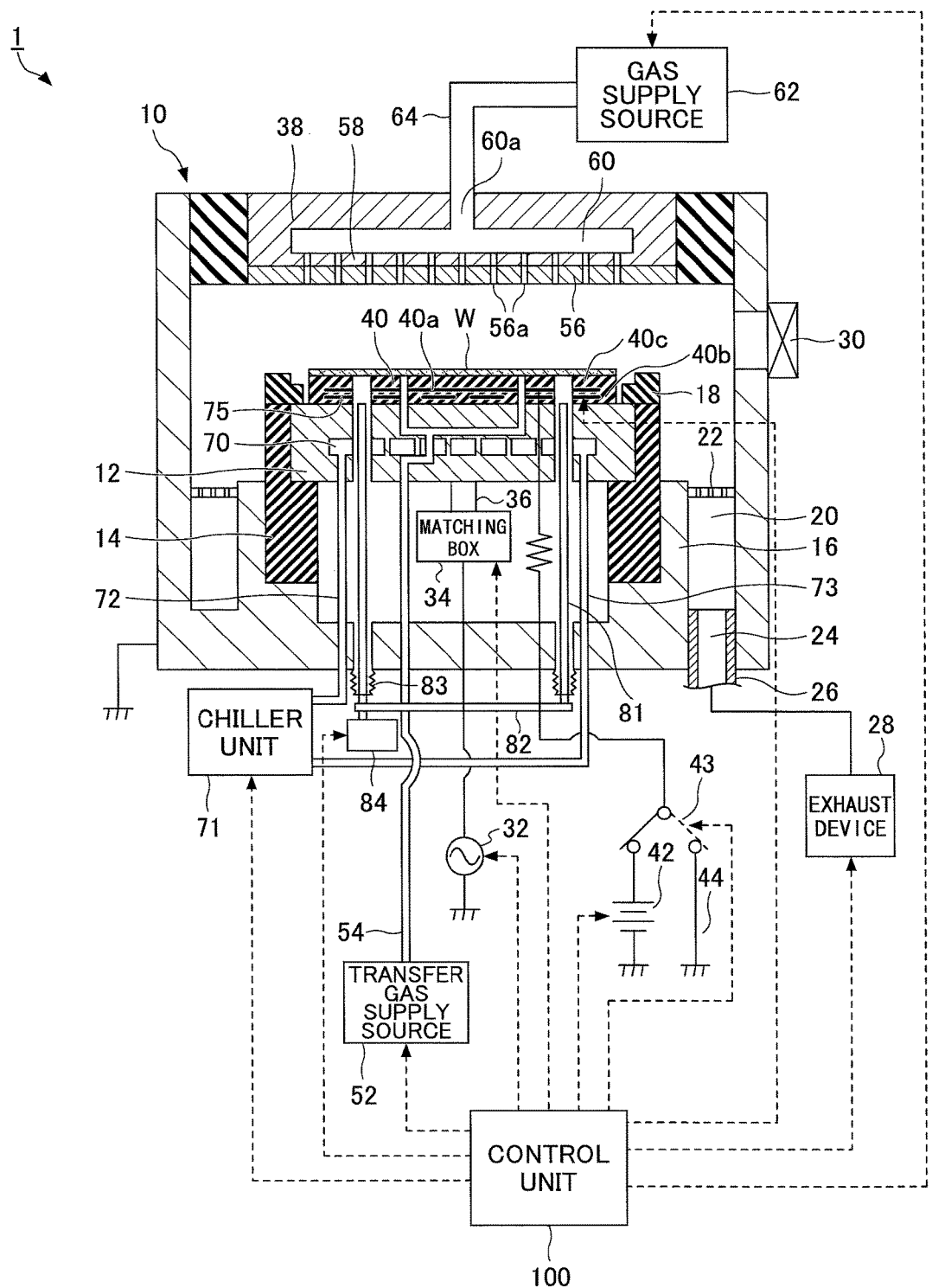
FIG. 1 is an overall configuration diagram illustrating a plasma processing apparatus according to an embodiment of the present invention.

A description is given below of embodiments of the present invention, with reference to accompanying drawings. Note that elements having substantially the same functions or features may be given the same reference numerals and overlapping descriptions thereof may be omitted. Here, units of measurement for pressure values can be converted by using a relationship of 1 Torr equal to 133.322 Pa.

[Overall Configuration of Plasma Processing Apparatus]

To begin with, a description is given below of an example of a plasma processing apparatus that performs an etching process described later. The plasma processing apparatus that can perform a method of controlling temperature according to an embodiment is not limited to a particular form, but a parallel plate type (which is also called a capacitively-coupled) plasma processing apparatus is taken as an example that can perform a plasma process such as an RIE (Reactive Ion Etching) process, an ashing process and the like on a semiconductor wafer (which is hereinafter called a wafer W) that is an object to be processed.

FIG. 1 illustrates an example of an overall configuration of the plasma processing apparatus according to the embodiment.

The plasma processing apparatus 1 according to the embodiment includes a cylindrical chamber (processing chamber 10) made of metal such as aluminum, stainless steel or the like. The processing chamber 10 is grounded. In the processing chamber 10, a plasma process such as the method of controlling the temperature of the embodiment described later or an etching process can be performed on the object to be processed.

In the processing chamber 10, there is a mounting table 12 for receiving a semiconductor wafer w (which is hereinafter called a wafer W) provided in the processing chamber 10. The mounting table 12 is, for example, made of aluminum, and is supported by a cylindrical support 16 vertically extending upward from the bottom of the processing chamber 10 through an insulting cylindrical holding part 14. A focus ring 18 made of, for example, quartz, and surrounding an upper surface of the mounting table 12 in a ring shape is arranged on an upper surface of the cylindrical holding part 14. The focus ring 18 focuses plasma generated above the mounting table 12 onto the wafer W.

An exhaust passage 20 is formed between an inner wall of the processing chamber 10 and the cylindrical support 16. A ring-shaped baffle plate 22 is attached to the exhaust passage 20. An exhaust port 24 is provided in a bottom part of the exhaust passage 20, and is connected to an exhaust device 28 through an exhaust pipe 26.

The exhaust device 28 includes a vacuum pump (not shown in the drawing), and reduces a pressure in the processing chamber 10 to a predetermined degree of vacuum. A gate valve 30 that opens and closes when carrying in/out the wafer W is attached to a side wall of the processing chamber 10.

The mounting table 12 is electrically connected to a high frequency power source 32 for plasma generation through a power feeding bar 36 and a matching box 34. The high frequency power source 32 supplies high frequency power, for example 60 MHz, to the mounting table 12. In this manner, the mounting table 12 also functions as a lower electrode.

A shower head 38 is provided in a ceiling part of the processing chamber 10 as an upper electrode having a ground potential. The high frequency power for plasma generation from the high frequency power source 32 is capacitively applied to the mounting table 12 and the shower head 38.

Figure 2:
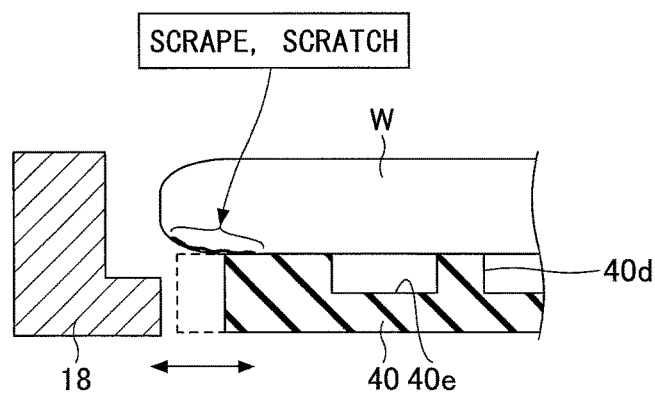
FIG. 2 is a diagram for illustrating a cause of particle generation according to an embodiment of the present invention.

There is an electrostatic chuck (ESC) 40 to hold the wafer W by an electrostatic attractive force provided on an upper surface of the mounting table 12. The electrostatic chuck 40 sandwiches a sheet-like chuck electrode 40a made of a conductive film between dielectric layers 40b and 40c of a pair of dielectric members. A direct voltage source 42 is connected to the chuck electrode 40a through a switch 43. Here, in general, as illustrated in FIG. 2 described later, convex portions 40d and concave portions 40e are formed in a wafer receiving surface of the electrostatic chuck 40. These convex portions 40d and the concaves portion 40e can be formed by, for example, embossing the electrostatic chuck 40 with the convex portions 40d.

The electrostatic chuck 40 attracts the wafer W on the chuck by a coulomb force by allowing a voltage to be applied from the direct voltage source 42. Moreover, when the voltage is not applied to the chuck electrode 40a, the chuck electrode 40a is in a state connected to ground by the switch 43. Hereinafter, the state in which the voltage is not applied to the chuck electrode 40a means the state in which the chuck electrode 40a is grounded.

A heat transfer gas supply source 52 supplies a heat transfer gas such as a helium (He) gas to a back surface of the wafer W on the electrostatic chuck 40 through a gas supply line 54.

The shower head 38 in the ceiling part includes an electrode plate 56 including many gas discharge holes 56a and a detachable electrode support 58 that supports the electrode plate 56. A buffer chamber 60 is provided inside the electrode support 58. A gas supply source 62 is coupled to a gas introduction port 60a of the buffer chamber 60 through a gas supply pipe 64. By such a configuration, an intended process gas is supplied into the processing chamber 10 from the shower head 38.

The shower head 38 in the ceiling part includes an electrode plate 56 including many of the gas discharge holes 56a and the detachable electrode support 58 that supports the electrode plate 56. The buffer chamber 60 is provided inside the electrode support 58. The gas supply source 62 is coupled to the gas introduction port 60a of the buffer chamber 60 through the gas supply pipe 64. The gas supply source 62 can control each of a variety of process gases independently, and can supply the variety of process gases into the processing chamber 10. By doing this, an intended gas is supplied from the shower head 38 into the processing chamber 10.

Plural support pins 81 (e.g., three pins) are provided inside the mounting table 12 in order to move the wafer W up and down between an external transfer arm (not shown in the drawing) and the inside of the processing chamber 10. The plural support pins 81 move up and down by the force of a motor 84 transmitted through a coupling member 82. Bottom bellows 83 are provided at through-holes for the support pins 81 that penetrate to the outside of the processing chamber 10, and maintain an air tight state between a vacuum side in the processing chamber 10 and an atmosphere side.

Furthermore, a magnet extending annularly or concentrically (not shown in the drawing) may be arranged around the processing chamber 10, for example, at two stages located at an upper position and a lower position.

Ordinarily, a refrigerant pipe 70 is provided inside the mounting table 12. A coolant of a predetermined temperature is supplied and circulated through the refrigerant pipe 70 from a chiller unit 71 through pipes 72 and 73. In addition, a heater 75 is embedded inside the electrostatic chuck 40. An alternating voltage is applied to the heater 75 from an alternate-current source (which is not shown in the drawing). A processing temperature of the wafer W on the electrostatic chuck 40 is adjusted to a desired temperature by cooling by using the chiller unit 71 and heating by using the heater 75.

The plasma processing apparatus 1 includes, for example, the gas supply source 62, the exhaust device 28, the heater 75, the direct voltage source 42, the switch 43, the matching box 34, the high frequency power source 32, the heat transfer gas supply source 52, the motor 84, and a control unit 100 that controls the operation of the chiller unit 71. The control unit 100 includes a CPU (Central Processing Unit), a ROM (Read Only Memory), and a RAM (Random Access Memory) (which are not shown in the drawing). The CPU executes at least a temperature control process of the embodiment described later in accordance with a variety of recipes stored in memory areas. In the recipes, control information of the apparatus corresponding to process conditions is described such as a process time, a pressure (gas exhaustion), a high frequency power and voltage, various process gas flow rates, a temperature inside the chamber (e.g., an upper electrode temperature, a side wall temperature of the chamber, an ESC temperature) and the like. Here, the recipes showing these programs and processing conditions may be stored in a hard disk or a semiconductor memory, or may be configured to be set at a predetermined location of a memory area stored in a portable recording medium readable by a computer such as a CD-ROM, a DVD or the like.

As discussed above, the overall configuration of the plasma processing apparatus 1 of the embodiment has been described. Next, a description is given below of scrapes on a wafer W on the electrostatic chuck 40 and the occurrence of particles due to scratches on the back surface of the wafer W, with reference to FIG. 2.

[Generation of Particles]

A temperature difference between the electrostatic chuck 40 and the wafer W increases when the wafer W is placed on an electrostatic chuck 40 having a preliminarily set high temperature compared to when the wafer W is placed on an electrostatic chuck that does not have a preliminarily set high temperature. When the temperature difference between the electrostatic chuck 40 and the wafer W increases, a thermal expansion difference generated between the wafer W and the electrostatic chuck 40 also increases. Hence, the thermal expansion difference between the electrostatic chuck 40 and the wafer W increases when the wafer W is placed on the electrostatic chuck 40 having the preliminarily set high temperature compared to when the wafer W is placed on the electrostatic chuck that does not have the preliminary set high temperature.

Sometimes particles are generated on the back surface of the wafer W because the back surface of the wafer W and the electrostatic chuck 40 are rubbed together due to thermal expansion difference between the electrostatic chuck 40 and the wafer W. In particular, friction due to the thermal expansion or heat contraction becomes greater on an outer periphery than on an inner periphery. As a result, many particles are liable to be generated in the area of the outer periphery of the back surface of the wafer W.

Figure 3:
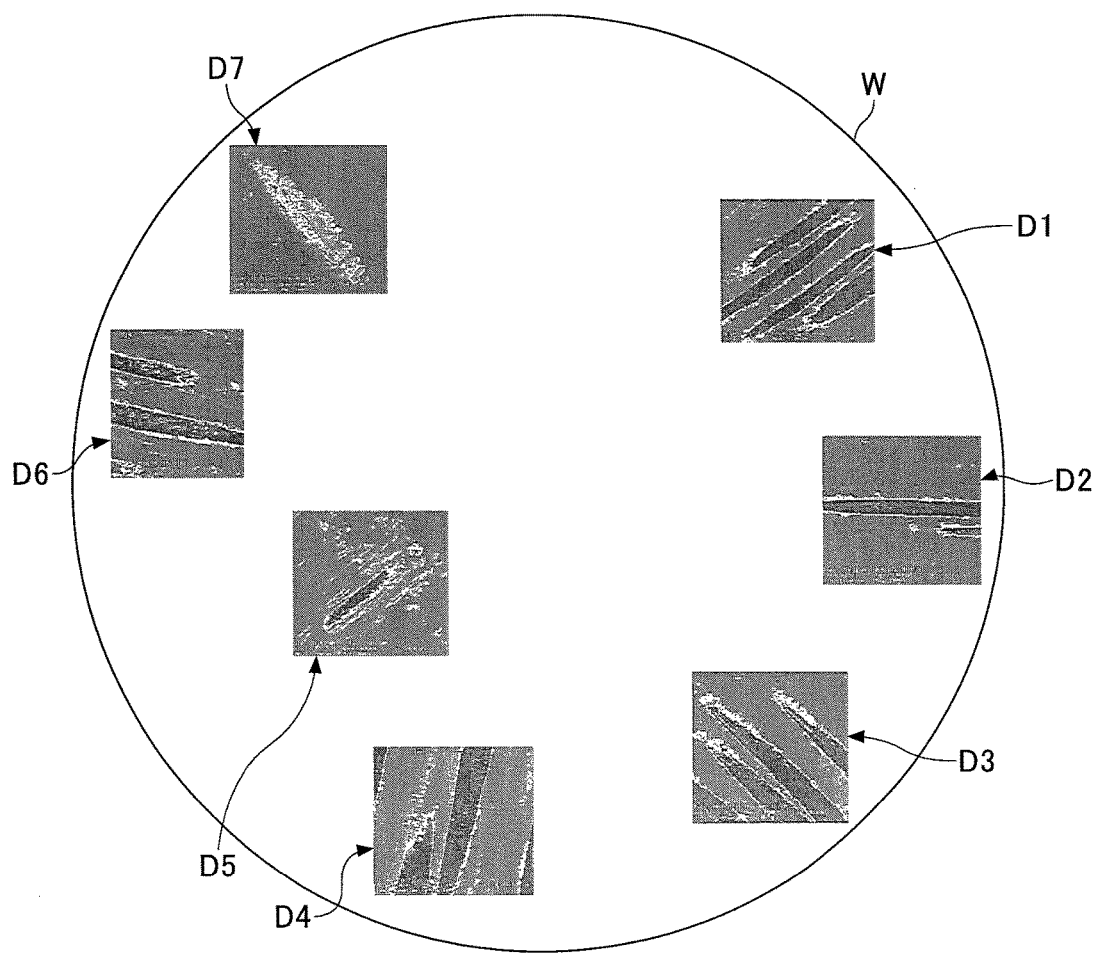
FIG. 3 is a diagram illustrating scratches generated on a wafer.

For example, FIG. 3 illustrates actual examples of scratches generated in the back surface of a wafer W. It is found that the scratches are generated at locations D1 through D7 of the back surface of the wafer W. Moreover, the scratches illustrated at D1 through D7 extend in radial directions. From this result, it is also expected that the scratches generated on the back surface of the wafer W are caused by the thermal expansion difference caused by the temperature difference generated between the wafer W and the electrostatic chuck 40.

Furthermore, as illustrated in FIG. 2, when plural dot-shaped convex portions 40d are provided on the surface of the electrostatic chuck 40 at regular intervals, a relatively strong frictional force is likely to occur at locations where the dot-shaped convex portions 40d contact the back surface of the wafer W.

[Relationship between Temperature and Particles]

Figure 4A:
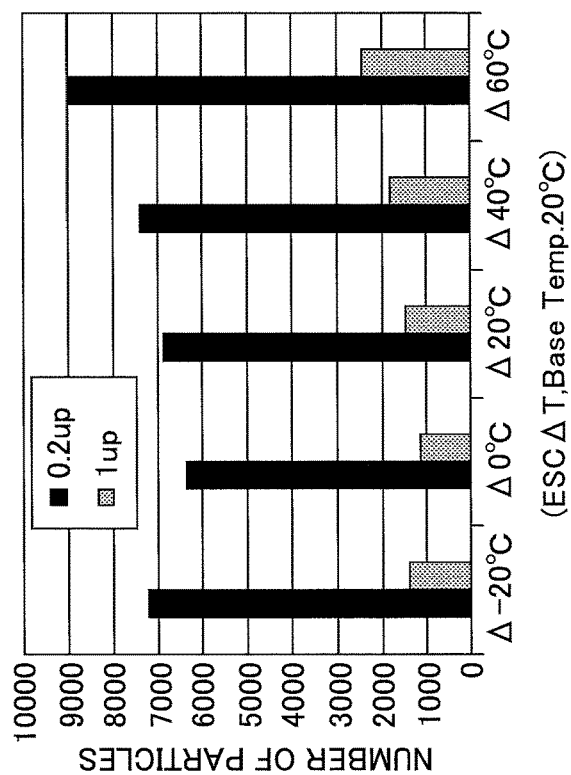
FIGS. 4A and 4B are generation results of particles of a plasma processing apparatus according to an embodiment of the present invention.
Figure 4B:
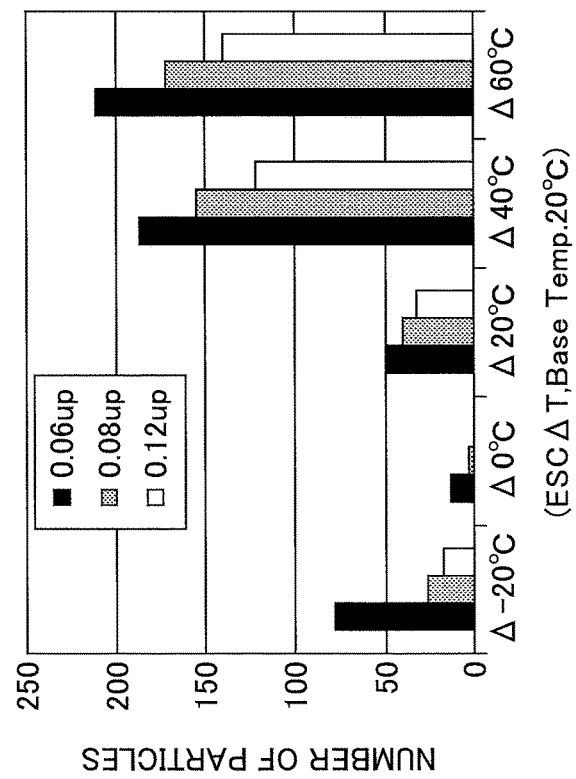

The inventors conducted an experiment about the relationship between the temperature difference between the electrostatic chuck and the wafer W and the number of particles generated on a back surface of the wafer W. FIGS. 4A and 4B show the experimental result.

FIGS. 4A and 4B show the temperature difference ΔT between the electrostatic chuck and the wafer W along the horizontal axis and the number of generated particles along the vertical axis of the graphs when the temperature of the wafer W is 20 degrees C. The vertical axis of the graph in FIG. 4A shows the number of particles on an upper surface of the wafer W, and the vertical axis of the graph in FIG. 4B shows the number of particles on the back surface of the wafer W. Here, a predetermined voltage HV is applied to the electrostatic chuck.

The results show that particles are generated when there is a temperature difference between the wafer W and the electrostatic chuck either on the upper surface of the wafer W (FIG. 4A) or on the back surface of the wafer W (FIG. 4B). From this, it was determined that the particles are generated on the back surface of the wafer W even when there was a slight temperature difference between the wafer W and the electrostatic chuck 40. More specifically, it is determined that the generation of particles cannot be effectively prevented by the temperature controlling method of keeping the thermal expansion difference between the wafer W and the electrostatic chuck in a predetermined range by keeping the temperature difference between the wafer temperature before placed on the electrostatic chuck and the maximum wafer temperature after placed on the electrostatic chuck in a preliminarily set temperature range.

Figure 5:
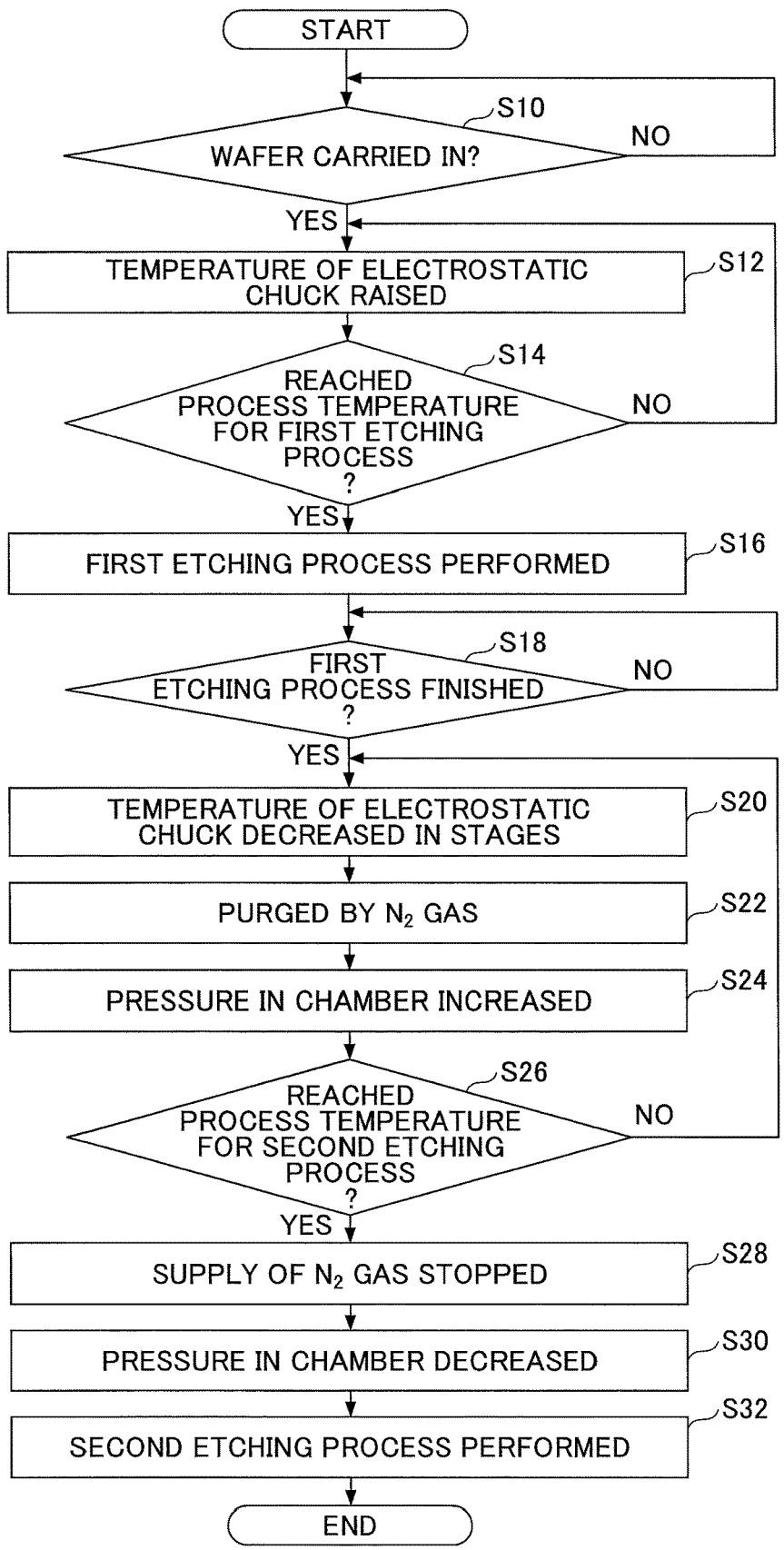
FIG. 5 is a flowchart illustrating a process of controlling temperature according to an embodiment of the present invention.
Figure 6:
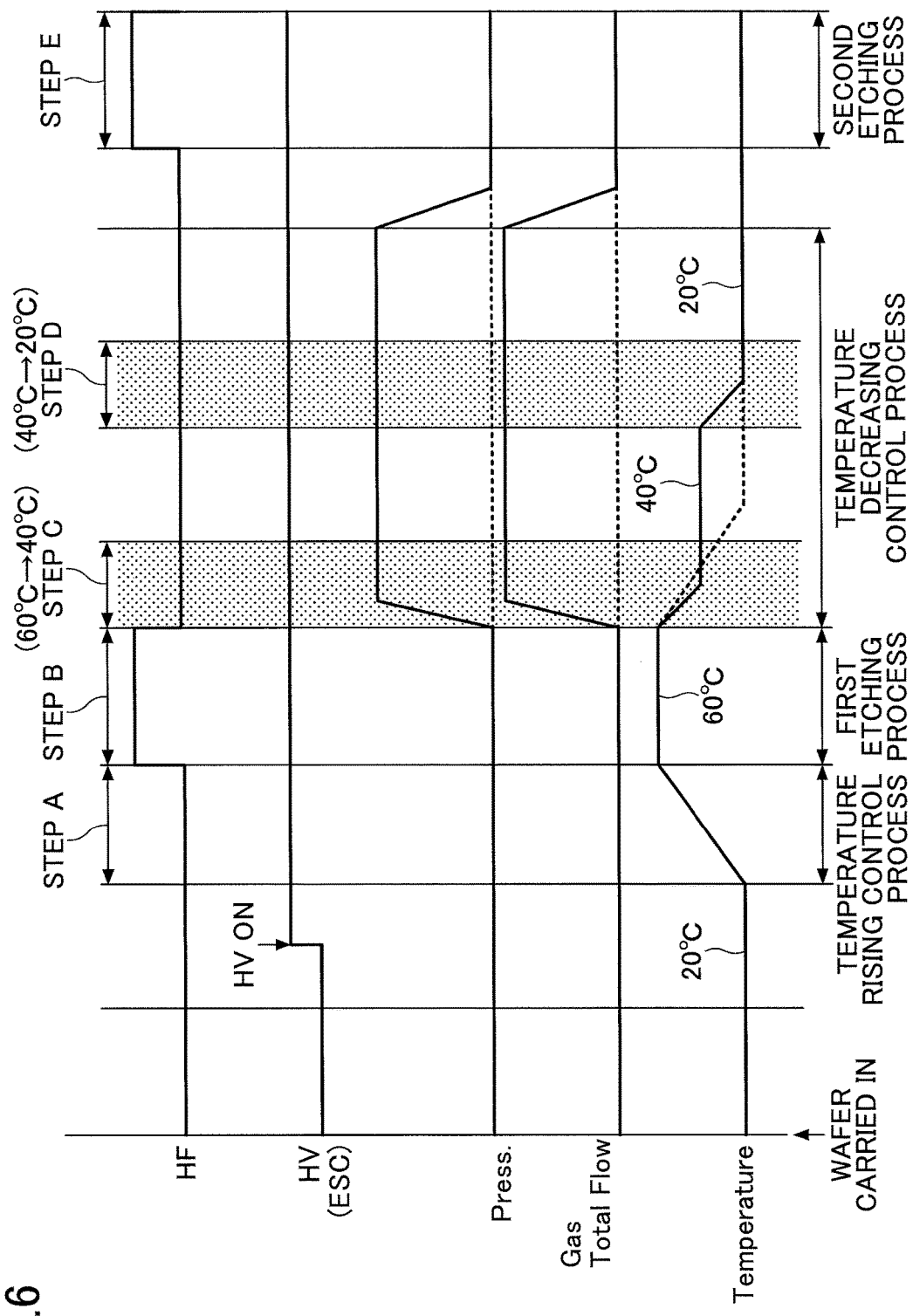
FIG. 6 is a time chart illustrating the process of controlling temperature according to the embodiment of the present invention.

As discussed above, in the embodiment, a method of controlling temperature that can effectively prevent the generation of particles is proposed. A description is given below of a procedure of temperature control by the method of controlling temperature according to the embodiment, with reference to FIGS. 5 and 6. FIG. 5 is a flowchart of the temperature control process according to the embodiment. FIG. 6 is a time chart of each process including the temperature control process according to the embodiment. As illustrated in FIG. 6, in the embodiment, after carrying a wafer W in the chamber, processes are performed in order of a temperature rising control process, a first etching process performed at a first temperature (60 degrees C., for example), a temperature decreasing control process (decreasing the temperature in a step-by-step manner), and a second etching process performed at a second temperature (20 degrees C., for example).

[Temperature Control]

The temperature control process illustrated in FIG. 5 is started, the control unit 100 determines whether a wafer is carried in the plasma processing apparatus 1 (step S10). The control unit 100 repeats the process of step S10 until the wafer W is carried in, and goes to step S12 when the wafer is carried in.

The left end of FIG. 6 shows a state of the wafer W carried in the plasma processing apparatus 1. After the wafer W is carried in, the control unit 100 turns on a voltage (HV) applied to the electrostatic chuck 40. Then, the control unit 100 raises a temperature of the electrostatic chuck 40 (step S12: temperature rising control process). The control unit 100 determines whether or not the temperature reaches a process temperature for a first etching process (step S14), and repeats the processes of steps S12 and S14 until the temperature reaches the process temperature for the first etching process.

In FIG. 6, the temperature rising control process is performed, and the temperature of the electrostatic chuck 40 is raised from 20 degrees C. to 60 degrees C. 60 degrees C. is the process temperature for the first etching process.

Here, in the temperature rising control process of step A, the temperature of the electrostatic chuck 40 is raised by heating the heater 75. Hence, when the wafer W is initially carried into the chamber and placed on the electrostatic chuck 40, there is no temperature difference between the wafer W and the electrostatic chuck 40. In addition, the temperature of the electrostatic chuck 40 is increased when the wafer W is on the electrostatic chuck 40 during the temperature rising process of step A. This ensures close contact between the wafer W and the electrostatic chuck 40, and can increase the temperatures of the electrostatic chuck 40 and the wafer W to the process temperature of the first etching process in a state hardly causing a temperature difference. This prevents friction from being caused between the wafer W and the electrostatic chuck 40 in the temperature rising control process. This can prevent particles from being formed on the back surface of the wafer W.

In step S14, when it is determined that the temperature of the electrostatic chuck 40 reaches the process temperature for the first etching process, the control unit 100 executes the first etching process (step S16: first etching process). In FIG. 6, because the temperature of the electrostatic chuck 40 reaches the process temperature of the first etching process, the first etching process is performed in step B.

An etching process using a mask containing a metal such as titanium nitride (TiN) can be taken as an example of the first etching process. In the etching process using the metal mask, the electrostatic chuck 40 is set at a high temperature to obtain a selective ratio to the mask. Here, in step B, the temperature of the electrostatic chuck 40 is controlled to be 60 degrees C.

Next, the control unit 100 determines whether or not the first etching process has ended (step S18), and repeats the determination process of step S18 until it is determined that the first etching process has ended. When it has been determined that the first etching process has ended, the control unit 100 decreases the temperature of the electrostatic chuck in a step-by-step manner (step S20: temperature decreasing control process).

In FIG. 6, the temperature decreasing control process is performed in steps C and D. The temperature of the electrostatic chuck 40 is decreased either in a way from 60 to 40 degrees C. or from 40 to 20 degrees C. in stages. Here, 20 degrees C. is the process temperature of the second etching process.

More specifically, the control unit 100 decreases the temperature of the electrostatic chuck 40 from 60 to 40 degrees C. in step C. After a predetermined period of time has passed since the temperature of the electrostatic chuck 40 was decreased to 40 degrees C., the control unit 100 further decreases the temperature of the electrostatic chuck 40 from 40 to 20 degrees C.

Here, in the embodiment, although the control unit 100 controls the decrease in the temperature of the electrostatic chuck 40 in two stages, the temperature decreasing control is not limited to the embodiment, and for example, the temperature decreasing control may be performed in three stages, four stages or more stages. Moreover, the control unit 100 may also control an increase in the temperature of the electrostatic chuck 40 in stages, even in the temperature rising control process of step A.

In the temperature decreasing control process, the control unit 100 purges the chamber with $N_2$ gas (step S22: purge process). The gas used in the purge process is not limited to $N_2$ gas, and can be any inactive gas. Ar gas is taken as another example of an inactive gas.

Furthermore, in the temperature decreasing control process, the control unit 100 controls the pressure to be higher than the pressure in the first etching process (step S24: pressure control process).

Here, in the embodiment, although the temperature decreasing control process, the purge process and the pressure control process are performed in parallel with each other, embodiments are not limited to this. However, at least a part of the temperature decreasing control process and a part of the purge process are performed in parallel with each other. Moreover, at least a part of the temperature decreasing control process, a part of the purge process, and a part of the pressure control process are preferred to be performed in parallel with each other.

Next, the control unit 100 determines whether or not the temperature of the electrostatic chuck 40 has reached a process temperature of a second etching process (step S26). The control unit 100 repeats the processes of S20 through S26 until the temperature has reached the process temperature of the second etching process. FIG. 6 illustrates a state in which the temperature decreasing process is performed in a step-by-step manner in steps C and D, and the temperature of the electrostatic chuck 40 has been gradually decreased from 60 degrees C. to 20 degrees C., with 20 degrees C. being the process temperature of the second etching process in the temperature decreasing control process.

In step S26, when it has been determined that the temperature of the electrostatic chuck 40 has reached the process temperature of the second etching process, the control unit 100 stops supplying the purge gas of $N_2$ gas (step S28). Moreover, the control unit 100 controls the pressure in the chamber to be lower than the pressure in the pressure control process (step S30). In FIG. 6, the purge gas of the $N_2$ gas is stopped after a predetermined period of time has passed since the temperature of the electrostatic chuck 40 was controlled so as to be decreased up to 20 degrees C. and the temperature decreasing control process has been finished, and the pressure in the chamber is decreased to the pressure before the temperature decreasing control process.

Finally, the control unit 100 performs the second etching process (step S32: second etching process). Then, the process flow ends. In FIG. 6, the second etching process is performed in step E.

As discussed above, the temperature control process according to the embodiment is described. Here, the first etching process and the second etching process are an example of the plasma treatment process. The plasma treatment process according to the embodiment is not limited to an etching process, but may be any process that performs a plasma process on a wafer W such as a film deposition process, an ashing process or the like. Here, 60 degrees C. for the process temperature of the first etching process is an example of the first temperature. Furthermore, 20 degrees C. for the process temperature of the second etching process is an example of a second temperature that is lower than the first temperature.

According to the temperature control process of the embodiments, after the plasma process is performed on the wafer W with the electrostatic chuck 40 configured to have its temperature adjustable by the heater 75 to have the first temperature, the temperature of the electrostatic chuck 40 is controlled to have the second temperature that is lower than the first temperature.

This causes the temperature of the electrostatic chuck 40 to be gradually controlled so as to be decreased. This can make the temperature of the wafer attracted on the electrostatic chuck 40 comply with the controlled temperature of the electrostatic chuck 40. This hardly makes a temperature difference between the wafer W and the electrostatic chuck 40 during the temperature decreasing control, which prevents a thermal expansion difference between the wafer W and the electrostatic chuck 40. As a result, the back surface of the wafer W and the electrostatic chuck 40 are prevented from being rubbed with each other and the generation of the particles from the back surface of the wafer W can be effectively prevented.

In particular, when the etching process is performed by using a mask containing metal such as titanium nitride (TiN), a process has been recently used of performing a high-temperature etching process to reduce an amount of loss of the mask at first, and an etching process at a temperature lower the high-temperature etching process after that. In such a process, the temperature control process according to the embodiments that can effectively reduce the generation of particles caused by the temperature difference between the electrostatic chuck 40 and the wafer W is particularly useful.

Moreover, in the embodiments, the temperature decreasing control process and the purge process are performed in parallel with each other. This serves to immediately exhaust the generated particles from the chamber 10 to the outside. As a result, the number of particles in the chamber 10 can be reduced further. Hence, only a part of each of the temperature decreasing control process and the purge process needs to be performed in parallel with each other, but the purge process is preferably performed simultaneously during the temperature decreasing control process.

Furthermore, in the embodiments, the pressure control process of controlling the pressure in the chamber 10 so as to be higher than the pressure during the plasma process (the first etching process in FIG. 6) is performed in parallel with the temperature decreasing process and the purge process. This can effectively exhaust a number of particles in the chamber 10. Accordingly, only a part of each of the temperature decreasing control process, the purge process and the pressure control process needs to be performed in parallel with each other, but preferably the purge process and the pressure control process are performed in parallel with each other during the temperature decreasing control process.

As discussed above, the method of controlling temperature and the plasma processing apparatus are described by the above embodiments, but the present invention is not limited to the above embodiments, and the present invention includes all such variations and modifications that may be made without departing from the scope of the present invention.

For example, the method of controlling temperature according to the embodiments of the present invention can be applied not only to the case of decreasing the temperature of the electrostatic chuck in stages in the temperature decreasing control process in the low-temperature process after the high-temperature process, but also to a case of raising the temperature of the electrostatic chuck in stages in the temperature rising control process in the high-temperature process after the low-temperature process.

The plasma processing apparatus using the method of controlling temperature according to the embodiments of the present invention can be applied to a plasma processing apparatus other than the apparatus illustrated in FIG. 1, and for example, an ashing processing apparatus, a film deposition apparatus or the like can be used. On this occasion, a capacitively coupled plasma (CCP) generation unit, an inductively coupled plasma (ICP) generation unit, a helicon wave plasma (HWP) generation unit, a microwave excitation surface wave plasma generation unit including microwave plasma generated from a radial line slot antenna or slot plane antenna (SPA) plasma, an electron cyclotron resonance (ECR) plasma generation unit, and a remote plasma generation unit using the above plasma generation unit can be used as a plasma generation unit to generate plasma in the plasma processing apparatus.

The object to be processed in the embodiments of the present invention is not limited to the (semiconductor) wafer used in the description of the embodiments, but for example, may be a large substrate for a flat panel display, a substrate for an EL (electroluminescence) device or a solar cell.

As described above, according to the embodiments of the present invention, generation of particles can be effectively prevented.

Here, the present invention is not limited to the configuration illustrated in the embodiments, but combining the configurations cited in the above embodiments with another component and the like are possible. In this regards, numerous variations and modifications are possible without departing from the scope of the present invention, and may be appropriately determined depending on such variations and modifications that may be made.

What is claimed is:

1. A method of controlling a temperature, the method comprising steps of:
    performing a first plasma process in a processing chamber on an object to be processed placed on an electrostatic chuck configured to have its temperature adjustable, the electrostatic chuck being controlled to have a first temperature;
    purging the processing chamber with an inactive gas by supplying the inert gas to a space above the object to be processed placed on the electrostatic chuck in the processing chamber after performing the first plasma process;
    changing the temperature of the electrostatic chuck from the first temperature to a second temperature that is lower than the first temperature during a first predetermined period of time;
    maintaining the temperature of the electrostatic chuck at the second temperature for a second predetermined period of time;
    changing the temperature of the electrostatic chuck from the second temperature to a third temperature that is lower than the second temperature during a third predetermined period of time, the second period of time being longer than each of the first period of time and the third period of time;
    stopping the supply of the inert gas to the space above the object to be processed in the processing chamber; and
    performing a second plasma process in the processing chamber on the object to be processed placed on the electrostatic chuck while maintaining the temperature of the electrostatic chuck at the third temperature after stopping the supply of the inert gas to the space above the object to be processed in the processing chamber,
    wherein at least part of any of the steps of changing the temperature of the electrostatic chuck from the first temperature to the second temperature, maintaining the temperature of the electrostatic chuck at the second temperature and changing the temperature of the electrostatic chuck from the second temperature to the third temperature is performed in parallel with the step of purging the processing chamber with the inactive gas.

2. The method as claimed in claim 1, further comprising steps of:
    carrying the object to be processed into the processing chamber; and
    controlling the temperature of the electrostatic chuck before starting the first plasma process so as to be the first temperature that is higher than the temperature of the electrostatic chuck when the object to be processed carried into the processing chamber.

3. The method as claimed in claim 1, further comprising:
controlling a pressure in the processing chamber to a first pressure that is higher than a second pressure set in the first plasma process, after finishing the first plasma process.

4. The method as claimed in claim 3, wherein at least part of the steps of changing the temperature of the electrostatic chuck from the first temperature to the second temperature, maintaining the temperature of the electrostatic chuck at the second temperature and changing the temperature of the electrostatic chuck from the second temperature to the third temperature is performed in parallel with the steps of purging the processing chamber and controlling the pressure in the processing chamber.

5. The method as claimed in claim 1, wherein the second predetermined period of time is longer than both of the first predetermined period of time and the third predetermined period of time.

6. The method as claimed in claim 3, further comprising:
controlling the pressure in the processing chamber before performing the second plasma process to be a third pressure that is lower than the first pressure.

7. The method as claimed in claim 1, wherein the second period of time being maintained longer than the first period of time and the third period of time.

8. The method as claimed in claim 1, wherein the inactive gas is supplied from a shower head provided in a ceiling part of the processing chamber.

9. A method of controlling a temperature, the method comprising steps of:
controlling a temperature of an electrostatic chuck configured to have its temperature adjustable, in a step-by-step manner so as to change from a first temperature to a second temperature that is lower than the first temperature after performing a first plasma process in a processing chamber on an object to be processed placed on the electrostatic chuck while maintaining the electrostatic chuck at the first temperature;
purging the processing chamber with an inactive gas after performing the first plasma process; and
performing a second plasma process in the processing chamber while maintaining the temperature of the electrostatic chuck at the second temperature,
wherein the steps of controlling the temperature of the electrostatic chuck and purging the processing chamber are at least partly performed in parallel with each other,
wherein the step of controlling the temperature of the electrostatic chuck in the step-by-step manner comprises steps of:
decreasing the temperature of the electrostatic chuck a plurality of times, the plurality of times for decreasing the temperature requiring respective periods of time; and
maintaining the temperature of the electrostatic chuck at a third temperature between the first temperature and the second temperature for a predetermined period of time, the predetermined period of time being longer than each of the periods of time required for the respective decreasing steps.

10. The method as claimed in claim 9, further comprising:
controlling the temperature of the electrostatic chuck after carrying the object to be processed into the processing chamber so as to be the first temperature that is higher than the temperature of the electrostatic chuck when the object to be processed carried into the processing chamber, before starting the first plasma process.

11. The method as claimed in claim 9, further comprising:
controlling a pressure in the processing chamber after performing the first plasma process to be a first pressure that is higher than a pressure in the processing chamber when performing the first plasma processing.

12. The method as claimed in claim 11, wherein at least part of any of the steps of controlling the temperature of the electrostatic chuck in the step-by-step manner, purging the inside of the processing chamber and controlling the pressure in the processing chamber is performed in parallel with each other.

13. The method as claimed in claim 1, wherein the second predetermined period of time is set to a period of time that causes a temperature of the object to be processed to follow the temperature of the electrostatic chuck.

14. The method as claimed in claim 9, wherein the predetermined period of time is set to a period of time that cause a temperature of the object to be processed to follow the temperature of the electrostatic chuck.

15. A method of controlling a temperature, the method comprising steps of:
performing a first plasma process in a processing chamber on an object to be processed placed on an electrostatic chuck configured to have its temperature adjustable, the electrostatic chuck being controlled to have a first temperature;
purging the processing chamber with an inactive gas by supplying the inert gas to a space above the object to be processed placed on the electrostatic chuck in the processing chamber after performing the first plasma process;
changing the temperature of the electrostatic chuck from the first temperature to a second temperature that is lower than the first temperature during a first predetermined period of time;
causing a temperature of the object to be processed to follow the temperature of the electrostatic chuck by maintaining the temperature of the electrostatic chuck at the second temperature for a second predetermined period of time;
changing the temperature of the electrostatic chuck from the second temperature to a third temperature that is lower than the second temperature during a third predetermined period of time;
stopping the supply of the inert gas to the space above the object to be processed in the processing chamber; and
performing a second plasma process in the processing chamber on the object to be processed placed on the electrostatic chuck while maintaining the temperature of the electrostatic chuck at the third temperature after stopping the supply of the inert gas to the space above the object to be processed in the processing chamber,
wherein at least part of any of the steps of changing the temperature of the electrostatic chuck from the first temperature to the second temperature, maintaining the temperature of the electrostatic chuck at the second temperature and changing the temperature of the electrostatic chuck from the second temperature to the third temperature is performed in parallel with the step of purging the processing chamber with the inactive gas, and
wherein the second period of time is longer than each of the first period of time and the third period of time.

* * * * *